United States Patent
Ishikawa et al.

(10) Patent No.: US 12,040,160 B2
(45) Date of Patent: Jul. 16, 2024

(54) SEMICONDUCTOR-MANUFACTURING APPARATUS MEMBER AND PLUG

(71) Applicant: NGK INSULATORS, LTD., Nagoya (JP)

(72) Inventors: Masaki Ishikawa, Handa (JP); Yasuho Aoki, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 262 days.

(21) Appl. No.: 17/457,725

(22) Filed: Dec. 6, 2021

(65) Prior Publication Data

US 2022/0246398 A1 Aug. 4, 2022

(30) Foreign Application Priority Data

Feb. 4, 2021 (JP) .................................. 2021-016385

(51) Int. Cl.
*H01J 37/32* (2006.01)
*C23C 16/458* (2006.01)
*H01L 21/687* (2006.01)

(52) U.S. Cl.
CPC ...... *H01J 37/3244* (2013.01); *C23C 16/4586* (2013.01); *H01L 21/6875* (2013.01)

(58) Field of Classification Search
CPC ................................................. H01L 21/6875
See application file for complete search history.

(56) References Cited

U.S. PATENT DOCUMENTS

| 5,720,818 A * | 2/1998 | Donde ................ C23C 16/4586 118/728 |
| 6,108,189 A * | 8/2000 | Weldon ............... C23C 16/4586 279/128 |
| 2009/0086401 A1 | 4/2009 | Samir et al. |
| 2016/0276198 A1 | 9/2016 | Anada et al. |
| 2017/0243726 A1 | 8/2017 | Kellogg |
| 2017/0352568 A1 | 12/2017 | Cho et al. |

(Continued)

FOREIGN PATENT DOCUMENTS

| JP | H10-050813 A | 2/1998 |
| JP | 2009-158917 A | 7/2009 |

(Continued)

OTHER PUBLICATIONS

Japanese Third Party Submission (Application No. 2021-016385) dated May 30, 2023.

*Primary Examiner* — Keath T Chen
(74) *Attorney, Agent, or Firm* — BURR PATENT LAW, PLLC

(57) ABSTRACT

A semiconductor-manufacturing apparatus member includes a ceramic plate having an upper surface serving as a wafer placement surface, a plug disposed in an undersurface of the ceramic plate and including a dense body and a gas flow channel that extends through the body in a thickness direction of the body while winding, a gas outlet port that extends through the ceramic plate in a thickness direction of the ceramic plate to be connected to an upper portion of the gas flow channel, and a metal cooling plate joined to the undersurface of the ceramic plate, and including a gas supply channel through which gas is supplied from a lower portion of the gas flow channel. In the plug, at least a portion in length of the gas flow channel is formed from a porous member.

11 Claims, 5 Drawing Sheets

(56) References Cited

U.S. PATENT DOCUMENTS

| | | | |
|---|---|---|---|
| 2019/0252231 A1 | | 8/2019 | Takasaki |
| 2020/0227291 A1 | | 7/2020 | Ishikawa et al. |
| 2020/0411355 A1 | * | 12/2020 | Noorbakhsh ..... H01L 21/68742 |
| 2021/0391204 A1 | | 12/2021 | Furukawa |

FOREIGN PATENT DOCUMENTS

| | | | | |
|---|---|---|---|---|
| JP | 2013-232641 | A | | 11/2013 |
| JP | 2014-209615 | A | | 11/2014 |
| JP | 2017157726 | | * 9/2017 | ........... H01L 21/683 |
| JP | 2019-519927 | A | | 7/2019 |
| JP | 2020-057786 | A | | 4/2020 |
| WO | WO2019/009028 | A1 | | 1/2019 |
| WO | WO2020/153449 | A1 | | 7/2020 |

* cited by examiner

US 12,040,160 B2

SEMICONDUCTOR-MANUFACTURING APPARATUS MEMBER AND PLUG

BACKGROUND OF THE INVENTION

1. Field of the Invention

The present invention relates to a semiconductor-manufacturing apparatus member and a plug.

2. Description of the Related Art

Examples of semiconductor-manufacturing apparatus member known thus far include a member including an electrostatic chuck having a wafer placement surface on its upper surface. For example, a semiconductor-manufacturing apparatus member described in Patent Literature 1 includes a cooling plate disposed on an undersurface of an electrostatic chuck with an intermediate plate interposed therebetween. The cooling plate has a gas feed port. The electrostatic chuck has a gas outlet port that extends through from the undersurface to the wafer placement surface. The intermediate plate and the cooling plate define an opening continuous with the gas feed port and the gas outlet port. A dense plug is arranged in this opening. The dense plug has a gas flow path that extends through between the upper surface and the lower surface while winding. The semiconductor-manufacturing apparatus member processes a wafer placed on the wafer placement surface in a chamber with plasma caused by introducing a gas material in the chamber and applying a radio frequency (RF) voltage for causing plasma on the cooling plate. At this time, backside gas such as helium is introduced into the gas feed port. The backside gas is supplied to the back surface of the wafer from the gas feed port through the gas flow path in the dense plug and the gas outlet port.

CITATION LIST

Patent Literature

PTL 1: US 2017/0243726 A1

SUMMARY OF THE INVENTION

An electric discharge (dielectric breakdown) may occur between the wafer and the cooling plate via the gas flow path in the dense plug. In Patent Literature 1, the gas flow path extending through the dense plug between the upper surface and the lower surface is bent and has a relatively long flow path length. Thus, dielectric breakdown is less likely to occur via the gas flow path, but the flow path length is not sufficient for preventing dielectric breakdown.

The present invention is made to address such a problem, and aims to provide a structure causing less dielectric breakdown than an existing structure.

A semiconductor-manufacturing apparatus member according to the present invention includes: a ceramic plate having an upper surface serving as a wafer placement surface, and including a built-in electrode; a plug disposed below a lower surface of the ceramic plate, and including a dense body and a gas flow channel that extends through the body in a thickness direction of the body while winding; a gas outlet port that extends through the ceramic plate in a thickness direction of the ceramic plate to be connected to an upper portion of the gas flow channel; and a metal cooling plate joined to the lower surface of the ceramic plate, and having a gas supply channel through which gas is supplied from a lower portion of the gas flow channel, wherein at least a portion in length of the gas flow channel is formed from a porous member with insulating properties and breathability.

In a semiconductor-manufacturing apparatus member, the plug has a gas flow channel that extends through the dense body in a thickness direction of the dense body while winding. At least a portion in length of the gas flow channel is formed from a porous member with insulating properties and breathability. In the porous portion, pores that are formed in the porous member and three-dimensionally continuous with each other (for example, forming a three-dimensional net) form a gas flow path. In this structure, the length of a substantial flow path in the gas flow channel is longer than when the entire gas flow channel is hollow. Thus, the semiconductor-manufacturing apparatus member less easily causes an electric discharge (dielectric breakdown) between a wafer and a cooling plate via the gas flow path.

Herein, "upper" and "lower" indicate the relative positional relationship instead of the absolute positional relationship. Thus, "upper" and "lower" may be changed to "lower" and "upper", "left" and "right", or "front" and "rear" depending on the orientation of the semiconductor-manufacturing apparatus member.

In a semiconductor-manufacturing apparatus member according to the present invention, at least a portion in length of the gas flow channel may be formed from a porous member with a pore rate of higher than or equal to 10% and lower than or equal to 50%. The porous member with a pore rate of lower than or equal to 50% is preferable as the substantial flow path has a sufficiently long length. Although a porous member with a lower pore rate is less likely to cause dielectric breakdown, the pore rate is preferably higher than or equal to 10% in view of a smooth gas flow.

In a semiconductor-manufacturing apparatus member according to the present invention, 30% or more in length of the gas flow channel may be formed from a porous member. The structure where 30% or more in length of the gas flow channel is formed from a porous member is preferable as the substantial flow path has a sufficiently long length.

In a semiconductor-manufacturing apparatus member according to the present invention, the gas flow channel may be helical. This structure can facilitate a gas flow.

In a semiconductor-manufacturing apparatus member according to the present invention, the plug may have a taper portion that has its diameter gradually decreasing toward the upper surface, and the electrode may be formed in a plane inside the ceramic plate crossing the taper portion and have a through-hole through which the plug extends. Compared to a plug without a taper portion, the plug with the taper portion can reduce the diameter of a through-hole formed in the electrode to allow the plug to extend therethrough.

In a semiconductor-manufacturing apparatus member according to the present invention, the plug may have, on a side surface, a stepped portion on a side surface that narrows a diameter of a lower side. In this case, in the semiconductor-manufacturing apparatus member, the ceramic plate may have a plug-receiving hole in a lower surface, the plug may be received in the plug-receiving hole, the plug-receiving hole and the plug may be in contact with each other in an area deeper than the stepped portion, a gap may be formed between the plug-receiving hole and the plug in an area shallower than the stepped portion, and a plug support member made of an adhesive material may be formed in the gap. Regardless of when an adhesive is injected into the gap between the plug and the plug-receiving hole to manufacture such a semiconductor-manufacturing apparatus member, the adhesive is prevented from flowing into the area further beyond the stepped portion, and prevented from flowing into a gas outlet port. Thus, the gas outlet port is prevented from being blocked by the adhesive material supporting the plug, that is, a plug support member.

A plug according to the present invention includes a dense body and a gas flow channel that extends through the body in a thickness direction of the body while winding, wherein at least a portion in length of the gas flow channel is formed from a porous member with insulating properties and breathability.

This plug has a gas flow channel that extends through the dense body in a thickness direction of the body while winding. At least a portion in length of the gas flow channel is formed from a porous member with insulating properties and breathability. In the porous portion, pores that are formed in the porous member and three-dimensionally continuous with each other (for example, forming a three-dimensional net) form a gas flow path. Thus, the length of a substantial flow path in the gas flow channel is longer than when the entire gas flow channel is hollow.

DETAILED DESCRIPTION OF THE INVENTION

Figure 1:
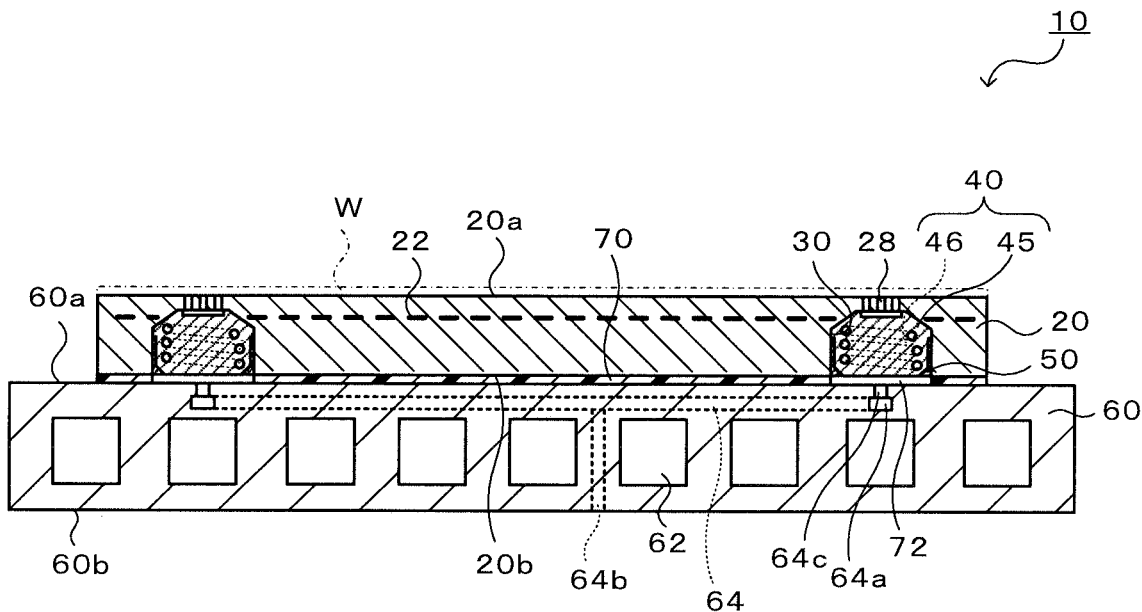
FIG. 1 is a cross-sectional view taken vertically through a semiconductor-manufacturing apparatus member 10.
Figure 2:
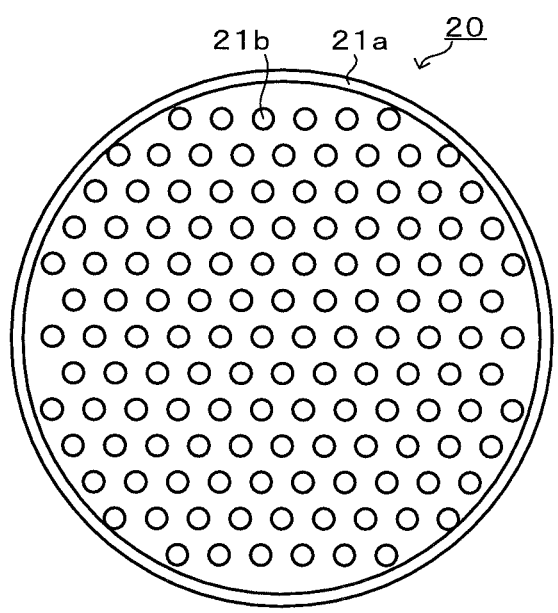
FIG. 2 is a plan view of a ceramic plate 20.
Figure 3:
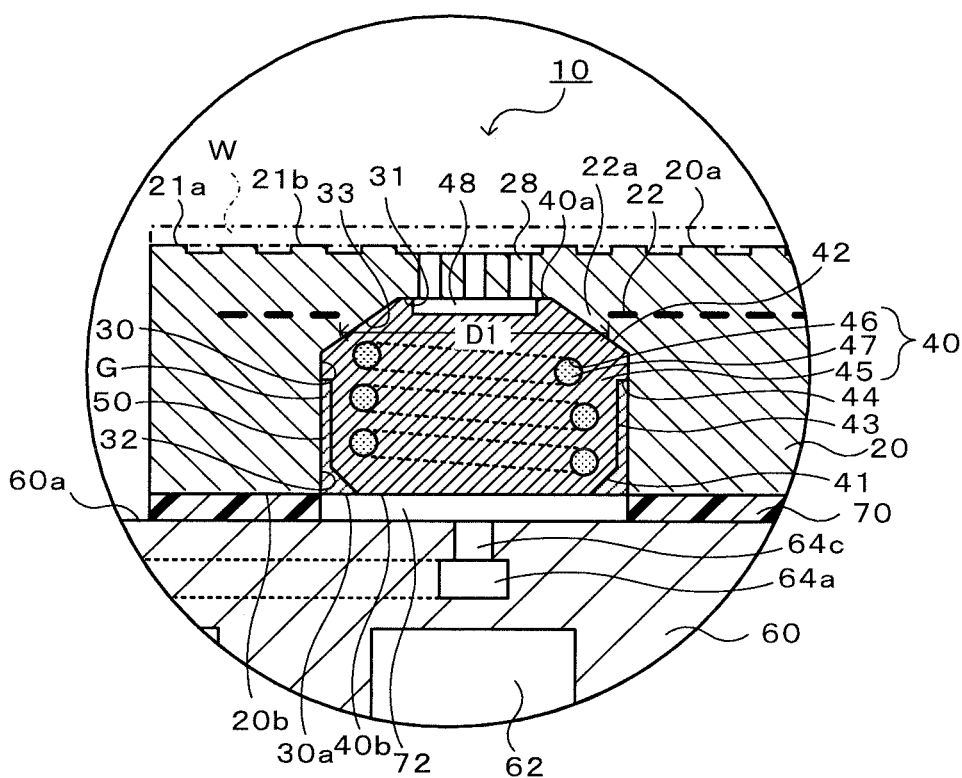
FIG. 3 is an enlarged view of part of the semiconductor-manufacturing apparatus member 10 illustrated in FIG. 1.
Figure 4:
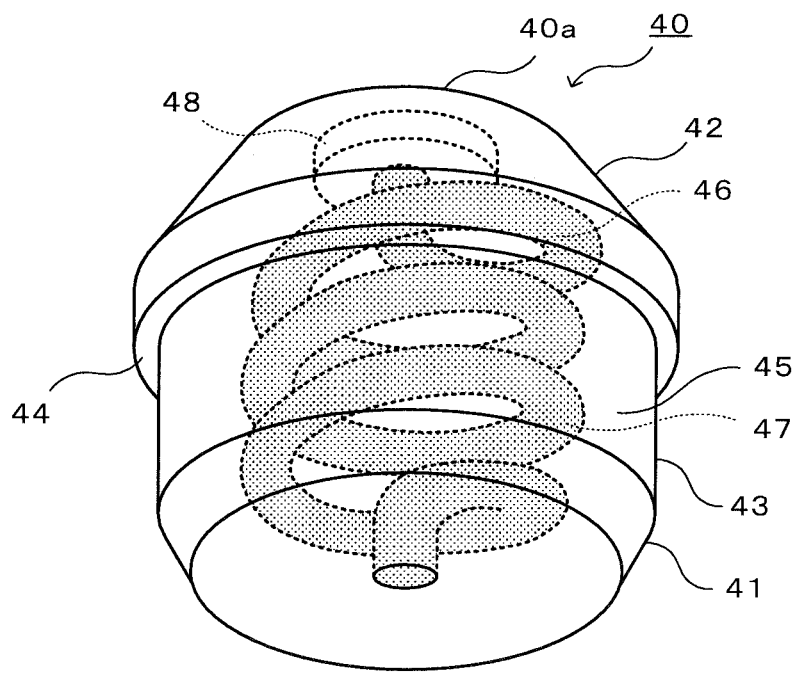
FIG. 4 is a perspective view of a plug 40.

Preferable embodiments of the present invention will be described with reference to the drawings. FIG. 1 is a cross-sectional view taken vertically through a semiconductor-manufacturing apparatus member 10, FIG. 2 is a plan view of a ceramic plate 20, FIG. 3 is an enlarged view of part of the semiconductor-manufacturing apparatus member 10 illustrated in FIG. 1, and FIG. 4 is a perspective view of a plug 40.

The semiconductor-manufacturing apparatus member 10 includes a ceramic plate 20, plugs 40, gas outlet ports 28, and a cooling plate 60.

The ceramic plate 20 is a ceramic disc (for example, with a diameter of 300 mm and a thickness of 5 mm) formed from an alumina sintered body or an aluminum nitride sintered body. The upper surface of the ceramic plate 20 serves as a wafer placement surface 20a. The ceramic plate 20 includes a built-in electrode 22. As illustrated in FIG. 2, a seal band 21a is disposed on the wafer placement surface 20a of the ceramic plate 20 along the outer edge, and multiple circular protrusions 21b are disposed on all over the wafer placement surface 20a. The seal band 21a and the circular protrusions 21b have the same height, which is, for example, several micrometers to several tens of micrometers. The electrode 22 is a planar mesh electrode used as an electrostatic electrode, and a DC voltage is applicable to the electrode 22. When a DC voltage is applied to the electrode 22, a wafer W is adsorbed and fixed to the wafer placement surface 20a with electrostatic adsorption. When the application of a DC voltage is removed, the wafer W adsorbed and fixed to the wafer placement surface 20a is released. The electrode 22 is also used as a RF electrode. Specifically, an upper electrode (not illustrated) is disposed above the wafer placement surface 20a. When high-frequency power is applied across parallel-plate electrodes formed from the upper electrode and the electrode 22 installed in the ceramic plate 20, plasma occurs. The electrode 22 has a through-hole 22a (refer to FIG. 3) to receive each plug 40. A predetermined insulation distance is secured between each plug 40 and the corresponding through-hole 22a in the electrode 22.

The ceramic plate 20 has multiple plug-receiving holes 30. The multiple (for example, 12 or 24 equidistantly formed along the circumferential direction) plug-receiving holes 30 are closed-end tubular holes formed in an undersurface 20b of the ceramic plate 20. Each plug-receiving hole 30 has a substantially cylindrical shape (for example, with an opening diameter of 8 mm and a full length of 4 mm). As illustrated in FIG. 3, a bevel 33 is formed between a bottom surface 31 and a side surface 32.

The gas outlet ports 28 are holes with a small diameter (for example, a diameter of 0.1 mm) that extends through the ceramic plate 20 in a thickness direction (vertical direction). In the present embodiment, the gas outlet ports 28 extend through the ceramic plate 20 in the thickness direction at a portion corresponding to a bottom wall of each plug-receiving hole 30. The multiple gas outlet ports 28 are formed for each plug 40. The gas outlet ports 28 are continuous with an upper portion of a gas flow channel 46 of the plug 40, described below.

The plugs 40 are disposed closer to the undersurface 20b of the ceramic plate 20. In the present embodiment, the plugs 40 are received in the plug-receiving holes 30 formed in the undersurface 20b of the ceramic plate 20. Each plug 40 includes a substantially cylindrical body 45 (for example, with a maximum outer diameter of 8 mm and a height of 4 mm) and a gas flow channel 46 that extends through the body 45 in the thickness direction (vertical direction) while winding.

The body 45 is a dense portion of each plug 40, forming a portion of the plug 40 other than the gas flow channel 46. Herein, "dense" indicates the property that does not allow backside gas to flow through. The body 45 may have, for example, a pore rate of less than 1%, or the body 45 preferably has a pore rate of less than 0.1%. Herein, "pore rate" refers to an open pore rate measured in the weight-in-water method (Archimedes' principle). When measurement in the weight-in-water method is inappropriate (for example, for a structure including part of the gas flow channel 46 is hollow), "pore rate" may be an area ratio of pores determined in an observation image, which is a typical cross section obtained through observation by a scanning electron microscope (SEM) at a magnification of 50. Preferably, the body 45 is formed from a ceramic material (such as an alumina or aluminum nitride) the same as that of the ceramic plate 20. A stepped portion 44 is disposed on a side surface 43 of the body 45 along the circumference of the body 45. A portion of the body 45 below the stepped portion 44 decreases its diameter. Each plug-receiving hole 30 and the body 45 are in contact with each other in an area of the plug-receiving hole 30 from a position deeper than the stepped portion 44 of the body 45 to a position before reaching a circular recess 48 formed to oppose the gas outlet ports 28. In an area of the plug-receiving hole 30 shallower than the stepped portion 44, a ring-shaped gap G is formed between the plug-receiving hole 30 and the body 45. This gap G receives a plug support member 50 made of an adhesive material with a ring shape the same as the shape of the gap G. Examples of the adhesive material includes insulating resin such as silicone resin, epoxy resin, and acrylic resin. Here, silicone resin is preferable. The body 45 is bonded to the ceramic plate 20 with the plug support member 50. The body 45 has a first taper portion 41 having a diameter gradually decreasing toward an undersurface 40b. The gap G between the first taper portion 41 and the plug-receiving hole 30 is thus gradually widened toward an opening 30a of the plug-receiving hole 30. The plug support member 50 receives the first taper portion 41 of the body 45 from below. The body 45 includes a second taper portion 42 having a diameter gradually decreasing toward the upper surface 40a. The second taper portion 42 is in contact with the bevel 33 of the plug-receiving hole 30. The circular recess 48 is formed in the upper surface 40a of the body 45. The circular recess 48 connects the space (gas flow path) in the gas flow channel 46 with the multiple gas outlet ports 28.

The gas flow channel 46 extends through the body 45 in the thickness direction while winding, and allows gas to flow in the thickness direction of the plug 40. In the present embodiment, the gas flow channel 46 runs helical about the thickness direction of the body 45, and has a full length of approximately 55 mm and a diameter of approximately 0.8 mm. Preferably, the gas flow channel 46 has a shape that has, when being hollow throughout, a lower end opening not viewable from an upper end opening. The entirety of the gas flow channel 46 is formed from a porous member 47 (refer to FIG. 4). FIG. 4 illustrates the porous member 47 with hatching. Herein, "porous member" refers to a material having pores that allow at least backside gas to flow therethrough and not completely hollow. In the present embodiment, the porous member 47 has a pore rate of approximately 40%. The porous member 47 may be a ceramic material the same as that of the body 45. When the boundary between the porous member 47 and the body 45 is not clear, an area in the observed cross section that has the shortest circumference and that encloses all the pores in the porous member 47 is referred to as the porous member 47.

For example, the plug 40 may be manufactured in the following manner. First, a compact or a sintered body obtained by sintering the compact is prepared to finally serve as the body 45. The compact may be formed by a 3D printer or mold casting. The details of mold casting are disclosed in, for example, Japanese Patent No. 5458050. Mold casting involves injecting, into a forming space of a forming die, a ceramic slurry containing ceramic powder, a solvent, a dispersant, and a gelling agent, and gelatinizing the ceramic slurry by causing the gelling agent to initiate a chemical reaction to form a compact in the forming die. In mold casting, a compact may be manufactured by using, as a forming die, an outer die and a core (a die with the same shape as the gas flow channel 46) formed from a material with a low melting point such as wax to be formed in the forming die, and by then eliminating the forming die with melting removal or combustion by heating the forming die to a temperature higher than or equal to the melting point. The material of the porous member 47 is placed in a hollow in the obtained compact or sintered body corresponding to the gas flow channel 46. Specifically, for example, a solvent is added as needed to a material obtained by adding a pore-forming material such as resin or wax into an aggregate such as ceramic powder to form the material into a slurry or paste, and the material is filled into the hollow corresponding to the gas flow channel 46 of the compact or the sintered body, and finally sintered as a whole. This sintering eliminates the pore-forming material in the material of the porous member 47 to form the porous member 47. Thus, the plug 40 including the body 45 and the porous member 47 integrated together is obtained.

The cooling plate 60 is a disk made of a metal such as metallic aluminum or an aluminum alloy (a disk with a diameter the same as or greater than the diameter of the ceramic plate 20). The cooling plate 60 has a coolant flow path 62 in which a coolant circulates. The cooling plate 60 has a gas supply channel 64 to supply backside gas to each plug 40 from below the gas flow channel 46. The gas supply channel 64 includes annular gas collectors 64a concentric with the cooling plate 60 in a plan view, a gas introduction portion 64b that introduces gas from an undersurface 60b of the cooling plate 60 to the gas collectors 64a, and gas distributors 64c that distribute gas to the plugs 40 from the gas collectors 64a. The gas distributors 64c are open in an upper surface 60a of the cooling plate 60. The cooling plate 60 is joined to the undersurface 20b of the ceramic plate 20. In the present embodiment, the cooling plate 60 is bonded to the undersurface 20b of the ceramic plate 20 with a resin-made bonding sheet 70 interposed therebetween. The bonding sheet 70 has, at a portion opposing each plug-receiving hole 30, a hole 72 with a diameter the same or slightly greater than the opening diameter of the plug-receiving hole 30. The cooling plate 60 may be joined to the undersurface 20b of the ceramic plate 20 with brazing filler metal instead of the bonding sheet 70.

An example of use of the semiconductor-manufacturing apparatus member 10 with this structure will be described now. First, the semiconductor-manufacturing apparatus member 10 is installed in a chamber not illustrated, and the wafer W is placed on the wafer placement surface 20a. The chamber is decompressed with a vacuum pump and adjusted to have a predetermined degree of vacuum, and a DC voltage is applied to the electrode 22 of the ceramic plate 20 to cause electrostatic adsorption to adsorb and fix the wafer W to the wafer placement surface 20a. Thereafter, the inside of the chamber is changed to a reactant gas atmosphere at a predetermined voltage (for example, several tens to several hundreds of Pa). In this state, a high frequency voltage is applied across an upper electrode, not illustrated, disposed at the ceiling of the chamber and the electrode 22 of the semiconductor-manufacturing apparatus member 10 to cause plasma. Instead of applying a high frequency voltage across the upper electrode and the electrode 22, a high frequency voltage may be applied across the upper electrode and the cooling plate 60. The surface of the wafer W is etched with the plasma thus caused. If the helical gas flow channel 46 of the plug 40 is entirely hollow, the plasma thus caused may cause an electric discharge between the wafer W and the cooling plate 60 via the hollow. In the present embodiment, however, the entirety of the helical gas flow channel 46 of the plug 40 is formed from the porous member 47 with insulating properties, and thus the substantial flow path length inside the gas flow channel 46 is long, and this structure can prevent such an electric discharge. A coolant circulates in the coolant flow path 62 of the cooling plate 60. Backside gas such as helium is introduced into the gas supply channel 64 from a gas cylinder, not illustrated. The backside gas flows through the gas supply channel 64, the gas flow channel 46, and the gas outlet ports 28 to be discharged to and enclosed in a space between the back surface of the wafer W and a portion of the wafer placement surface 20a where the seal band 21a and the circular protrusions 21b are not disposed. The backside gas facilitates thermal conduction between the wafer W and the ceramic plate 20.

In the semiconductor-manufacturing apparatus member 10 described above in detail, the plug 40 has the gas flow channel 46 that extends through the dense body 45 in the thickness direction while winding. The entirety of the gas flow channel 46 is formed from the porous member 47 with insulating properties and breathability. Thus, the substantial flow path length in the gas flow channel 46 is longer than when part or the entire gas flow channel 46 is hollow. This semiconductor-manufacturing apparatus member 10 can thus prevent dielectric breakdown through the gas flow path.

At least a portion (here, the entirety) in length of the gas flow channel 46 is formed from the porous member 47 with a pore rate of greater than or equal to 10% and less than or equal to 50% (specifically, approximately 40%). This structure can thus prevent dielectric breakdown via the gas flow path and facilitate smooth gas flow. The porous member 47 that forms the at least a portion in length of the gas flow channel 46 preferably has a pore rate of greater than or equal to 20% and less than or equal to 50%, or more preferably has a pore rate of greater than or equal to 30% and less than or equal to 50%.

The gas flow channel 46 is helical, and thus can facilitate smooth gas flow.

The plug 40 includes the second taper portion 42. The electrode 22 has the through-hole 22a formed in a plane inside the ceramic plate 20 crossing the second taper portion 42 to allow the plug 40 to extend therethrough. The diameter D1 (refer to FIG. 3) of the through-hole 22a formed in the electrode 22 to allow the plug 40 including the second taper portion 42 to extend therethrough can be reduced further than for a plug not including the second taper portion 42 (refer to FIG. 7). Compared to a structure where the plug 40 is thinned throughout the full length to fit the through-hole 22a, the helical gas flow channel 46 formed in the plug 40 can have a longer length.

The plug 40 is joined to the ceramic plate 20 with the ring-shaped plug support member 50 made of an insulating resin. The upper end of the gas flow channel 46 is located on one of the surfaces of the plug 40 across the plug support member 50 (surface closer to the ceramic plate 20), and the lower end of the gas flow channel 46 is located on the other surface of the plug 40 across the plug support member 50 (surface closer to the cooling plate 60). Thus, regardless of when a gap is left between the plug 40 and the ceramic plate 20, the plug support member 50 blocks the gap in front of the cooling plate 60. This structure is less likely to allow an electric discharge (dielectric breakdown) between the wafer W and the cooling plate 60 via a gap between the plug 40 and the ceramic plate 20.

The plug 40 includes the stepped portion 44 on the side surface 43. The plug-receiving hole 30 and the plug 40 are in contact with each other in an area deeper than the stepped portion 44. A gap G is formed between the plug-receiving hole 30 and the plug 40 in an area shallower than the stepped portion 44, and the plug support member 50 made of an adhesive material is formed in the gap G. Thus, regardless of when an adhesive is injected into the gap G between the plug-receiving hole 30 and the plug 40 to manufacture the semiconductor-manufacturing apparatus member 10, the adhesive is prevented from flowing further beyond the stepped portion 44, and is prevented from flowing into the gas outlet ports 28. Thus, the gas outlet ports 28 are prevented from being blocked by the adhesive material supporting the plug 40 or the plug support member 50.

The present invention is not limited by the embodiments described above, and may naturally be embodied in various forms within the technical scope thereof.

For example, in the above embodiment, the entirety of the gas flow channel 46 is formed from the porous member 47. However, a portion in length of the gas flow channel 46 may be formed from the porous member 47. As a portion formed from the porous member 47 increases, dielectric breakdown via the gas flow path can be further effectively reduced. A portion in length of the gas flow channel 46 formed from the porous member 47 is preferably greater than or equal to 30%, more preferably greater than or equal to 50%, or further preferably greater than or equal to 90%. When a portion in length of the gas flow channel 46 is formed from the porous member 47, the remaining portion in length may be formed from a hollow. For example, at least one of the upper and lower end portions in length of the gas flow channel 46 may be a hollow and the remaining portion may be formed from the porous member 47.

In the above embodiment, the full length of the gas flow channel 46 is approximately 55 mm. However, for example, the full length of the gas flow channel 46 may be greater than or equal to 20 mm and less than or equal to 60 mm, or greater than or equal to 40 mm and less than or equal to 55 mm. The full length of the gas flow channel 46 may be, for example, greater than or equal to five times of, and less than or equal to fifteen times of the thickness of the body 45. The full length of the gas flow channel 46 greater than or equal to 20 mm or five times of the thickness of the body 45 is preferable as a substantial path length is sufficiently long. As the gas flow channel 46 has a longer full length, dielectric breakdown is less likely to occur. However, in view of securing a cross-sectional area of the gas flow channel 46 for smooth gas flow, the full length of the gas flow channel 46 is preferably less than or equal to 60 mm or fifteen times of the thickness of the body 45.

In the above embodiment, the diameter of the gas flow channel 46 is approximately 0.8 mm, but may be, for example, greater than or equal to 0.4 mm and less than or equal to 1.0 mm. The diameter of the gas flow channel 46 may be, for example, greater than or equal to 1/10 of, and less than or equal to 1/4 of the thickness of the body 45.

In the above embodiment, the substantial flow path length (minimum path length) in the gas flow channel 46 may be, for example, greater than or equal to 1.2 times of, and less than or equal to 3.0 times of the full length of the gas flow channel 46, or greater than or equal to 1.5 times of, and less than or equal to 2.5 times of the full length of the gas flow channel 46.

In the above embodiment, a resistance heating element may be embedded in the ceramic plate 20. This structure can more precisely control the temperature of the wafer W.

Figure 5:
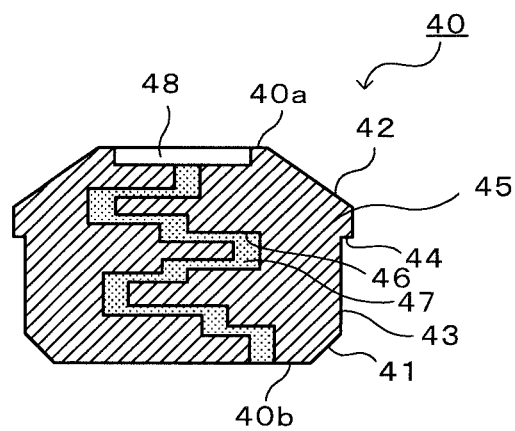
FIG. 5 is a cross-sectional view taken vertically through another example of a gas flow channel 46.
Figure 6:
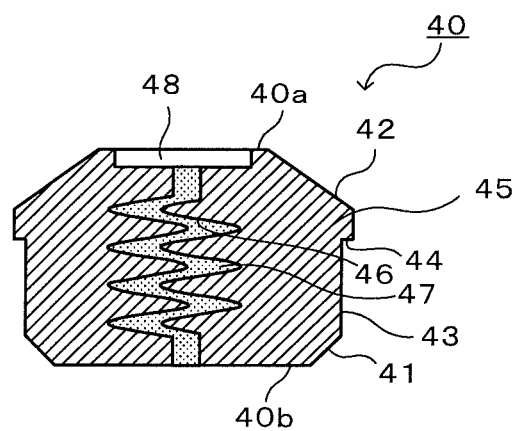
FIG. 6 is a cross-sectional view taken vertically through another example of a gas flow channel 46.

In the above embodiment, the gas flow channel 46 inside each plug 40 is helical, but is not particularly limited to this example. For example, the gas flow channel 46 may have a shape with multiple bends (such as a zigzag) illustrated in FIGS. 5 and 6. In FIGS. 5 and 6, components the same as those in the above embodiment are denoted with the same reference signs. In FIG. 5, the zigzag of the gas flow channel 46 has right angles. Each of these angles may be an acute angle or an obtuse angle. In FIG. 6, the gas flow channel 46 has rounded angles, or no angles. Such zigzags may be two-dimensional or three-dimensional. The gas flow channel 46 has an angled helical shape with a polygonal periphery when viewed from above. The number of windings in the helix or the number of bends in a zigzag is not limited to a particular number. Such a structure can also effectively prevent an electric discharge from occurring via the gas flow path.

In the above embodiment, each plug 40 is bonded to the ceramic plate 20 with the plug support member 50 made of an insulating resin, but this is not the only example. For example, the plug 40 may be ceramic-jointed to the ceramic plate 20. More specifically, the joint (also referred to as an insulating joint) between the plug 40 and the ceramic plate 20 may be made of ceramics. Herein, "ceramic-jointing" refers to ceramics jointed together with ceramics. Ceramic-jointing is less likely to degrade the jointed portion than when both ceramics are bonded together with the plug support member 50 made of an insulating resin. For example, ceramic-jointing may be solid state bonding such as sintering bonding or diffusion bonding. Sintering bonding is a jointing method by inserting ceramic powder into a joint interface, and heating the ceramic powder while applying pressure to sinter the ceramic powder. Diffusion bonding is a jointing method by heating ceramics under pressure while the ceramics are direct contact with each other to diffuse structural elements. The plug 40 may be bonded (ceramic-jointed) to the ceramic plate 20 with a ceramic adhesive. For example, the plug 40 may be screwed onto the ceramic plate 20. More specifically, a female screw may be formed in the side surface 32 and/or the bevel 33 of the plug-receiving hole 30, a male screw may be formed in the side surface 43 and/or the second taper portion 42 of the plug 40, and the plug 40 may be screwed into the plug-receiving hole 30.

Figure 7:
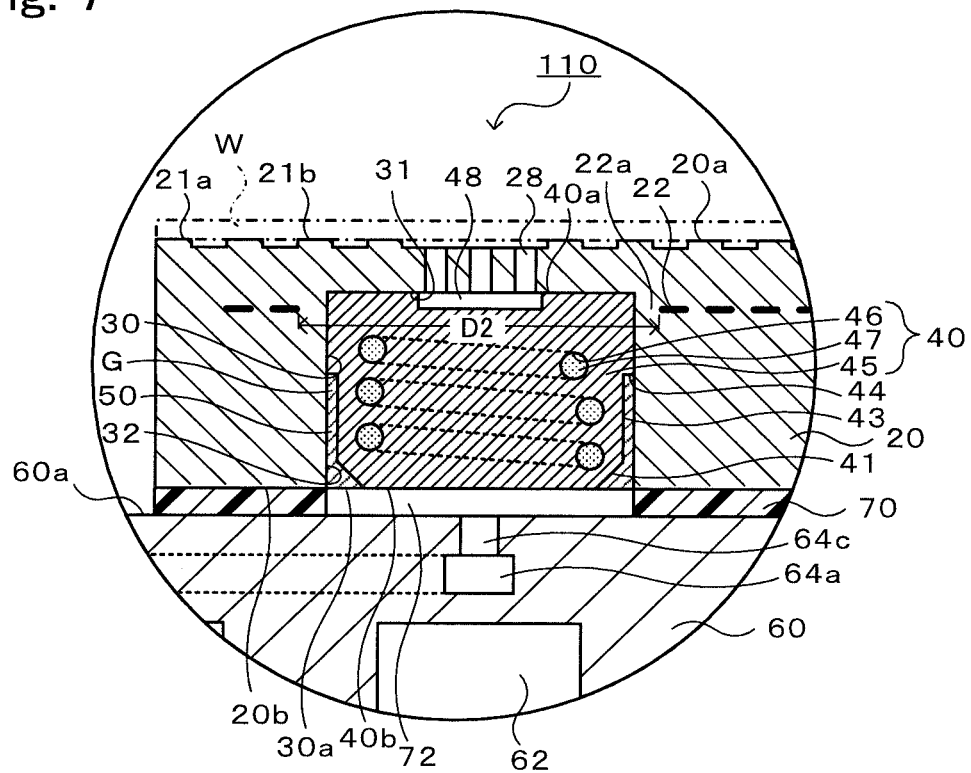
FIG. 7 is an enlarged view of part of a semiconductor-manufacturing apparatus member 110 in a vertical cross section.

In the above embodiment, each plug 40 includes the second taper portion 42, and the bevel 33 is formed at each plug-receiving hole 30. However, as in the semiconductor-manufacturing apparatus member 110 illustrated in FIG. 7, the second taper portion 42 or the bevel 33 may be omitted. In FIG. 7, components the same as those in the above embodiment are denoted with the same reference signs. In this structure, a diameter D2 of each through-hole 22a of the electrode 22 is greater than the diameter D1 according to the embodiment, as the plug 40 and the through-hole 22a of the electrode 22 need to be spaced apart from each other by a predetermined insulation distance.

Figure 8:
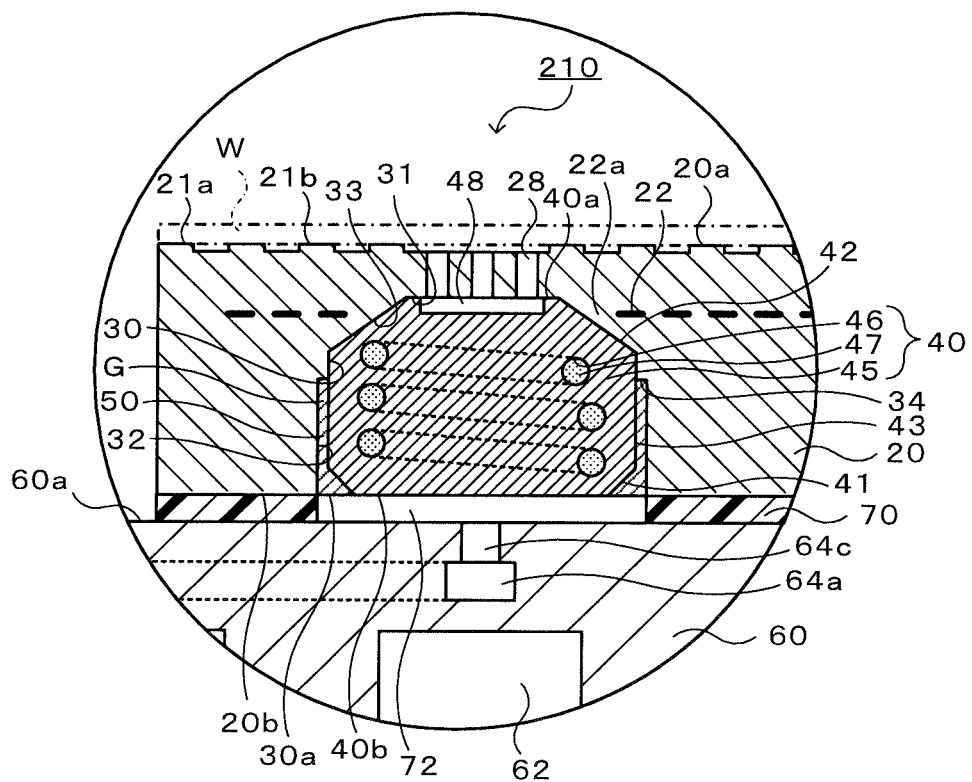
FIG. 8 is an enlarged view of part of a semiconductor-manufacturing apparatus member 210 in a vertical cross section.

In the above embodiment, the stepped portion 44 is disposed on the side surface 43 of each plug 40. However, as in a semiconductor-manufacturing apparatus member 210 illustrated in FIG. 8, instead of the stepped portion 44 disposed on the side surface 43 of the plug 40, a stepped portion 34 below which the plug-receiving hole 30 decreases the diameter upward (toward the bottom) may be disposed on the side surface 32 of the plug-receiving hole 30. In FIG. 8, components the same as those of the above embodiment are denoted with the same reference signs. In the semiconductor-manufacturing apparatus member 210, the plug-receiving hole 30 and the plug 40 are in contact with each other in an area of the plug-receiving hole 30 from a position deeper than the stepped portion 34 to a position in front of the gas outlet ports 28. A gap G is formed between the plug-receiving hole 30 and the plug 40 in an area of the plug-receiving hole 30 shallower than the stepped portion 34. The plug support member 50 is formed in the gap G. Thus, regardless of when an adhesive is injected into the gap G between the plug-receiving hole 30 and the plug 40 to manufacture the semiconductor-manufacturing apparatus member 210, the adhesive is prevented from flowing further beyond the stepped portion 34, and is prevented from flowing into the gas outlet ports 28. Thus, the gas outlet ports 28 are prevented from being blocked by the adhesive material supporting the plug 40 or the plug support member 50.

In the above embodiment, the stepped portion 44 is disposed on the side surface 43 of the plug 40. Instead, the stepped portion 44 disposed on the side surface 43 of the plug 40 and the stepped portion 34 disposed on the side surface 32 of the plug-receiving hole 30 may be omitted. In this structure, a gap G may be formed between the plug-receiving hole 30 and the plug 40 in an area of the plug-receiving hole 30 other than the bottom surface 31, and the plug support member 50 may be formed in the gap G. An adhesive injected into the gap G between the plug-receiving hole 30 and the plug 40 to manufacture such a semiconductor-manufacturing apparatus member may flow into the gas outlet ports 28 and block the gas outlet ports 28. Thus, in this semiconductor-manufacturing apparatus member, the gas outlet ports 28 may be blocked by the adhesive material that supports the plug 40 or the plug support member 50. In contrast, in the semiconductor-manufacturing apparatus member 10 according to the embodiment, the plug-receiving hole 30 and the plug 40 are in contact with each other in an area of the plug-receiving hole 30 from a position deeper than the stepped portion 44 of the plug 40 to a position in front of the gas outlet ports 28. Thus, regardless of when an adhesive is injected into the gap G between the plug-receiving hole 30 and the plug 40 to manufacture the semiconductor-manufacturing apparatus member 10 according to the embodiment, the adhesive is prevented from flowing further beyond the stepped portion 44. Thus, in the semiconductor-manufacturing apparatus member 10 according to the embodiment, the adhesive is prevented from flowing into the gas outlet ports 28, and the gas outlet ports 28 are prevented from being blocked by the plug support member 50.

In the above embodiment, the plug 40 has the first taper portion 41, but the first taper portion 41 may be omitted.

Figure 9:
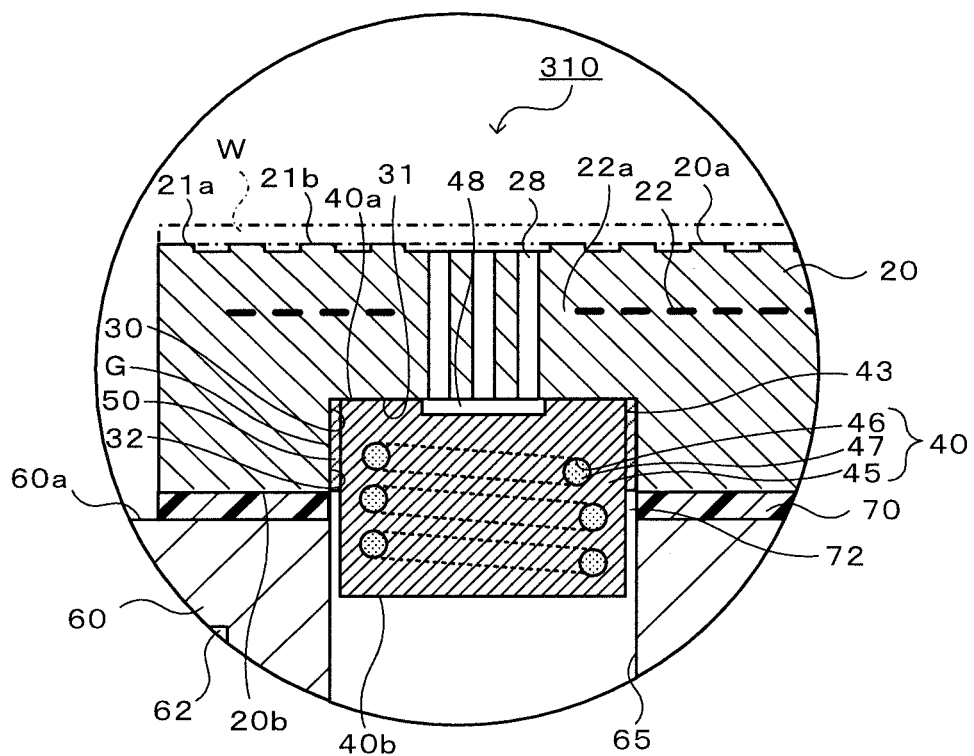
FIG. 9 is an enlarged view of part of a semiconductor-manufacturing apparatus member 310 in a vertical cross section.
Figure 10:
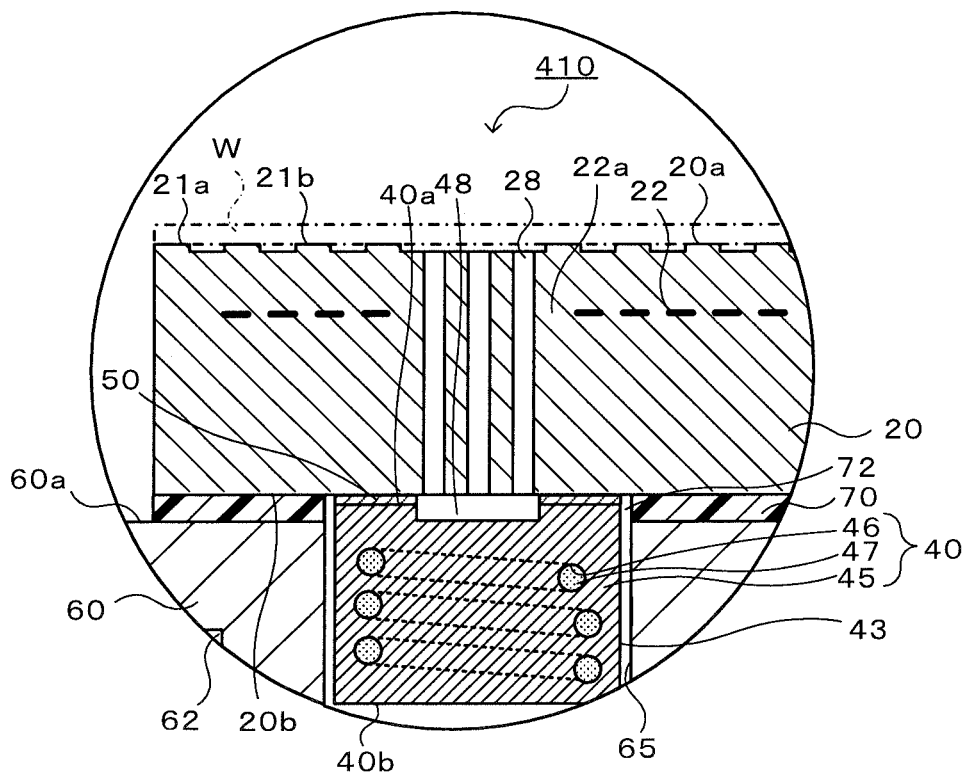
FIG. 10 is an enlarged view of part of a semiconductor-manufacturing apparatus member 410 in a vertical cross section.

In the above embodiment, the plug 40 is received in the plug-receiving hole 30 formed in the undersurface 20b of the ceramic plate 20. However, this is not the only example. For example, as in a semiconductor-manufacturing apparatus member 310 illustrated in FIG. 9, the cooling plate 60 may include a tubular plug-receiving hole 65 open in the upper surface 60a, and part of the plug 40 may be received in the plug-receiving hole 65. Alternatively, as in a semiconductor-manufacturing apparatus member 410 illustrated in FIG. 10, the ceramic plate 20 may omit the plug-receiving hole 30, the cooling plate 60 may have a tubular plug-receiving hole 65 open in the upper surface 60a, and part or the entirety of the plug 40 may be received in the plug-receiving hole 65. In such structures, the gas outlet ports 28 have a long length, and prevent dielectric breakdown. In FIGS. 9 and 10, components the same as those of the above embodiment are denoted with the same reference signs. In FIG. 10, instead of forming the plug support member 50 in the ring-shaped gap G between the plug-receiving hole 30 and the plug 40 to bond the plug 40 to the ceramic plate 20, a ring-shaped plug support member 50 with a shape substantially the same as the shape of the upper surface 40a of the plug 40 is formed between the undersurface 20b of the ceramic plate 20 and the upper surface 40a of the plug 40 to bond the plug 40 to the ceramic plate 20. Also in this structure, regardless of when a gap is left between the plug 40 and the ceramic plate 20, the gap is blocked by the plug support member 50 in front of the cooling plate 60. This structure is thus less likely to cause an electric discharge between the wafer W and the cooling plate 60 via the gap between the plug 40 and the ceramic plate 20. The plug-receiving hole 65 may be a through-hole or a closed-end hole. When the plug-receiving hole 65 is a through-hole, backside gas is supplied from a portion of the plug-receiving hole 65 lower than the plug 40 to the plug 40 from below the gas flow channel 46. When the plug-receiving hole 65 is a closed-end hole, in a structure other than the structure where the gas distributor 64c is disposed on the bottom surface of the plug-receiving hole 65 instead of the upper surface 60a of the cooling plate 60, a gas supply channel similar to the gas supply channel 64 of the semiconductor-manufacturing apparatus member 10 according to the embodiment may be formed.

In the above embodiment, multiple gas outlet ports 28 are formed for each plug 40, but one gas outlet port 28 may be formed for each plug 40.

The present application claims priority from Japanese Patent Application No. 2021-016385, filed on Feb. 4, 2021, the entire contents of which are incorporated herein by reference.

What is claimed is:

1. A plug, comprising:
 a dense body; and
 a gas flow channel that extends through the body in a thickness direction of the body having multiple windings,
 wherein at least one winding of the multiple windings of the gas flow channel is formed from a porous member with insulating properties and breathability,
 wherein the plug includes a first taper portion with a diameter gradually decreasing toward an under surface of the plug, and
 wherein the plug includes a second taper portion with a diameter gradually decreasing toward an upper surface of the plug.

2. The plug according to claim 1, wherein the dense body has a pore rate of less than 1%.

3. The plug according to claim 1, wherein a full length of the gas flow channel is greater than or equal to 5 times and less than or equal to 15 times of a thickness of the dense body.

4. A semiconductor-manufacturing apparatus member comprising:
 a ceramic plate having an upper surface serving as a wafer placement surface, and including a built-in electrode;
 a plug disposed in a lower surface of the ceramic plate, and including a dense body and a gas flow channel that extends through the body in a thickness direction of the body having multiple windings;
 a gas outlet port that extends through the ceramic plate in a thickness direction of the ceramic plate to be connected to an upper portion of the gas flow channel; and
 a metal cooling plate joined to the lower surface of the ceramic plate, and including a gas supply channel through which gas is supplied from a lower portion of the gas flow channel,
 wherein at least one winding of the multiple windings of the gas flow channel is formed from a porous member with insulating properties and breathability,
 wherein the plug includes a first taper portion with a diameter gradually decreasing toward the lower surface of the ceramic plate,
 wherein the plug includes a second taper portion with a diameter gradually decreasing toward the upper surface of the ceramic plate, and
 wherein the electrode has a through-hole that is formed in a plane inside the ceramic plate crossing the second taper portion to allow the plug to extend therethrough.

5. The semiconductor-manufacturing apparatus member according to claim 4, wherein the porous member that forms the at least one winding of the multiple windings of the gas flow channel has a pore rate of greater than or equal to 10% and less than or equal to 50%.

6. The semiconductor-manufacturing apparatus member according to claim 4, wherein all of the windings of the multiple windings of the gas flow channel is formed from the porous member.

7. The semiconductor-manufacturing apparatus member according to claim 4, wherein the gas flow channel is helical.

8. The semiconductor-manufacturing apparatus member according to claim 1, wherein the plug has a stepped portion on a side surface that narrows a diameter of a lower side.

9. The semiconductor-manufacturing apparatus member according to claim 4, wherein the dense body has a pore rate of less than 1%.

10. The semiconductor-manufacturing apparatus member according to claim 4, wherein a full length of the gas flow channel is greater than or equal to 5 times and less than or equal to 15 times of a thickness of the dense body.

11. The semiconductor-manufacturing apparatus member according to claim 4, wherein the second taper portion includes a bevel formed at a plug-receiving hole formed in the ceramic plate.

* * * * *